(12) United States Patent
Mizuguchi et al.

(10) Patent No.: US 6,465,098 B2
(45) Date of Patent: Oct. 15, 2002

(54) ELECTROMAGNETIC WAVE ABSORBING MATERIAL

(75) Inventors: Yoshifumi Mizuguchi; Hitoshi Ushijima, both of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/779,670

(22) Filed: Feb. 9, 2001

(65) Prior Publication Data

US 2001/0016254 A1 Aug. 23, 2001

(30) Foreign Application Priority Data

Feb. 10, 2000 (JP) .................................... 2000-033840

(51) Int. Cl.[7] .............................................. D02G 3/00
(52) U.S. Cl. ...................... 428/401; 428/372; 428/408
(58) Field of Search ................................ 428/522, 520, 428/292.1, 364, 401, 372, 408

(56) References Cited

U.S. PATENT DOCUMENTS 4,654,273 A * 3/1987 Gurgiolo et al. ............ 428/522

FOREIGN PATENT DOCUMENTS

| JP | 8-172292 | 7/1996 |
| JP | 10-27986 | 1/1998 |

* cited by examiner

*Primary Examiner*—Merrick Dixon
(74) *Attorney, Agent, or Firm*—Morgan, Lewis & Bockius LLP

(57) ABSTRACT

An electromagnetic wave absorbing material is provided by shaping a resin composition containing 5 to 10 parts by weight of a carbon black and 1 to 10 parts by weight of a gas phase growth carbon fiber in a resin based on 100 parts by weight of the resin.

2 Claims, 6 Drawing Sheets

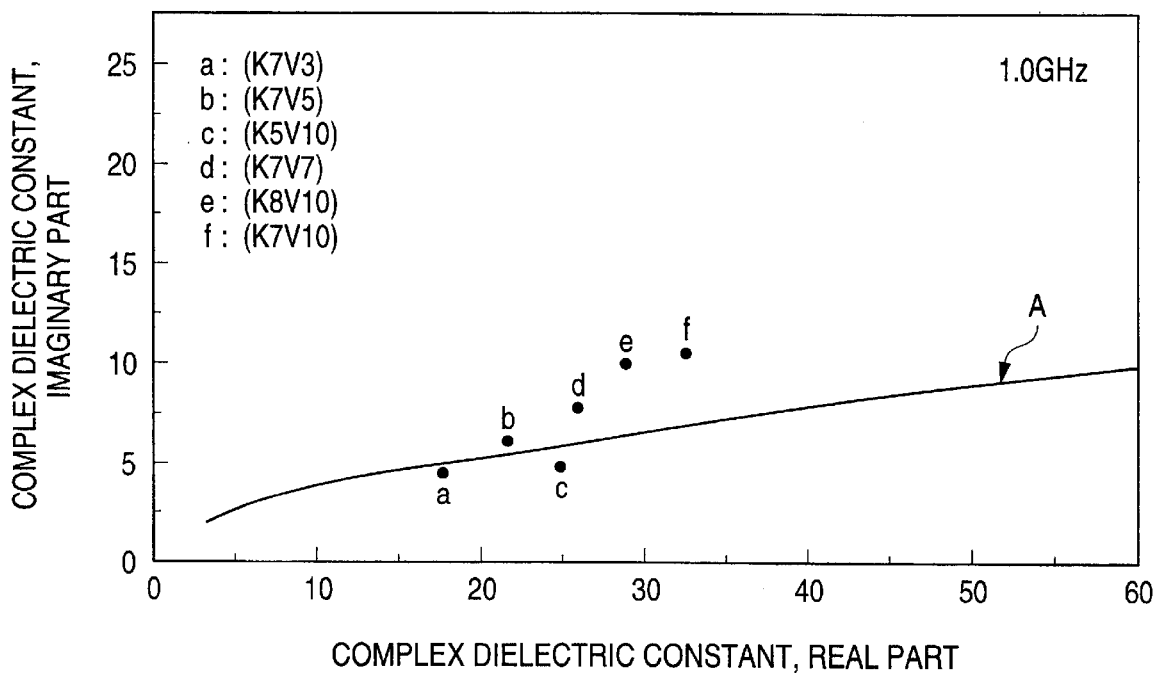
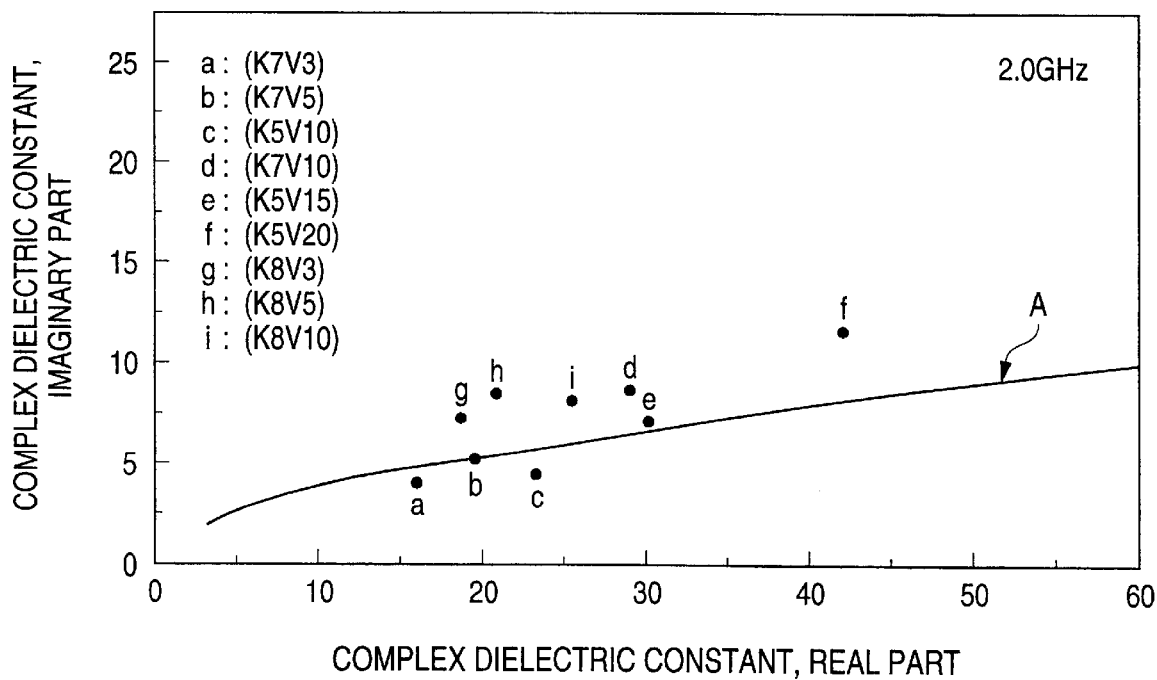

ELECTROMAGNETIC WAVE ABSORBING MATERIAL

BACKGROUND OF INVENTION

1. Field of Invention

The present invention relates to an electromagnetic wave absorbing material, more specifically, it relates to an electromagnetic wave absorbing material having a high electromagnetic wave absorbing ability in a wide frequency range in the vicinity of 1 to 20 GHz, and the excellent processing property and application property.

2. Related Art

Recently, propagation of mobile communication devices such as portable phones, and radio communication devices such as radio LAN is on the constant rise. According to that, the operation error of the devices, and the problem of the so-called radio interference such as leakage of the information, cross talk, and generation of the noise have been serious. As the countermeasure for the radio interference, an electromagnetic wave absorbing material is used commonly, and various electromagnetic wave absorbing material have been developed and used practically. For example, JP-A-8-172292 discloses an electromagnetic wave absorbing material containing 30 to 60 parts by weight of a furnace black and 5 to 20 part by weight of a carbon short fiber having a 10 to 20 $\mu$m fiber diameter and a 0.3 to 1 mm fiber length based on 100 parts by weight of a rubber, particularly effective for an electromagnetic wave of a 1.8 to 2 GHz frequency, which is a PHS (personal handy-phone system) range. Moreover, JP-A-10-27986 discloses an electromagnetic wave absorbing material containing total 80% by weight or less of a carbon black and a carbon fiber having a 0.1 to 50 $\mu$m fiber diameter and a 1 $\mu$m to 5 mm fiber length, particularly effective for an electric wave in an L band (1 to 2 GHz) and an S band (2 to 4 GHz). These electromagnetic wave absorbing materials are used commonly in a form of a one layer structure with a metal plate or a metal foil jointed on one surface thereof, and are mounted on the wall surface, or the like in the vicinity of an antenna.

In general, an electromagnetic wave absorbing material is produced by forming a resin composition obtained by adding a carbon black or a carbon fiber in a resin and kneading the same into a sheet-like shape. However, since conventional electromagnetic wave absorbing materials including the above-mentioned electromagnetic wave absorbing material contain a large amount of the carbon black or the carbon fiber, a mixing operation is required over a long time in preparation of the resin composition. Moreover, since the resin composition to be obtained is a highly filled material, it has a low flowability, and thus a problem, such as the need of a high shaping pressure, is involved in terms of the processing property. Furthermore, since an electromagnetic wave absorbing material as the shaped product is heavy and has a low flexibility, it is also problematic in terms of the operation property and the application property. In particular, since the used carbon fibers have a large diameter and a long fiber length, the gap in the part wherein carbon fibers are superimposed becomes large with a low filling density when they are dispersed in a resin. Therefore, in order to obtain a sufficient electromagnetic wave absorbing ability, a large amount of the carbon fibers should be contained.

Furthermore, although the electromagnetic wave absorbing ability can be provided with respect to the PHS band, the L band, or the S band, the effect is unknown with respect to a high frequency range higher than, for example, 10 GHz. It is highly expected that the radio communication application range will be spread more and more in the future, and the electric wave to be used will be moved to a higher frequency range accordingly. For example, in the so-called "intelligent transport system (ITS)", a frequency in a several tens of GHz band is scheduled to be allocated. Including the above-mentioned electromagnetic wave absorbing material, electromagnetic wave absorbing materials suitable for the use in such a high frequency range have not been provided so far.

SUMMARY OF INVENTION

In view of the circumstances, the invention has been achieved, and an object thereof is to provide an electromagnetic wave absorbing material capable of providing the excellent electromagnetic wave absorbing ability in a wide frequency range in the vicinity of 1 to 20 GHz despite a small content of a carbon black, carbon fiber, or the like, and the excellent processing property and application property.

The present inventors found out that an electromagnetic wave absorbing ability same as or higher than that of the conventional embodiment can be obtained even if the amount of the carbon fiber and the carbon black is cut back drastically by using a special carbon fiber produced by the gas phase growth (gas phase growth carbon fiber), and have completed the invention.

That is, in order to achieve the above-mentioned object, the invention provides an electromagnetic wave absorbing material by shaping a resin composition containing 5 to 10 parts by weight of a carbon black and 1 to 10 parts by weight of a gas phase growth carbon fiber in a resin based on 100 parts by weight of the resin.

BRIEF DESCRIPTION OF DRAWINGS

FIG. 1 is a graph showing the relationship between the imaginary part and the real part of the complex dielectric constant measured at a 1.0 GHz frequency for electromagnetic wave absorbing materials produced with the composition ratio of a carbon black and a gas phase growth carbon fiber changed.

FIG. 2 is a graph showing the relationship between the imaginary part and the real part of the complex dielectric constant measured at a 2.0 GHz frequency for electromagnetic wave absorbing materials produced with the composition ratio of a carbon black and a gas phase growth carbon fiber changed.

DETAILED DESCRIPTION OF PREFERRED EMBODIMENTS

Figure 3:
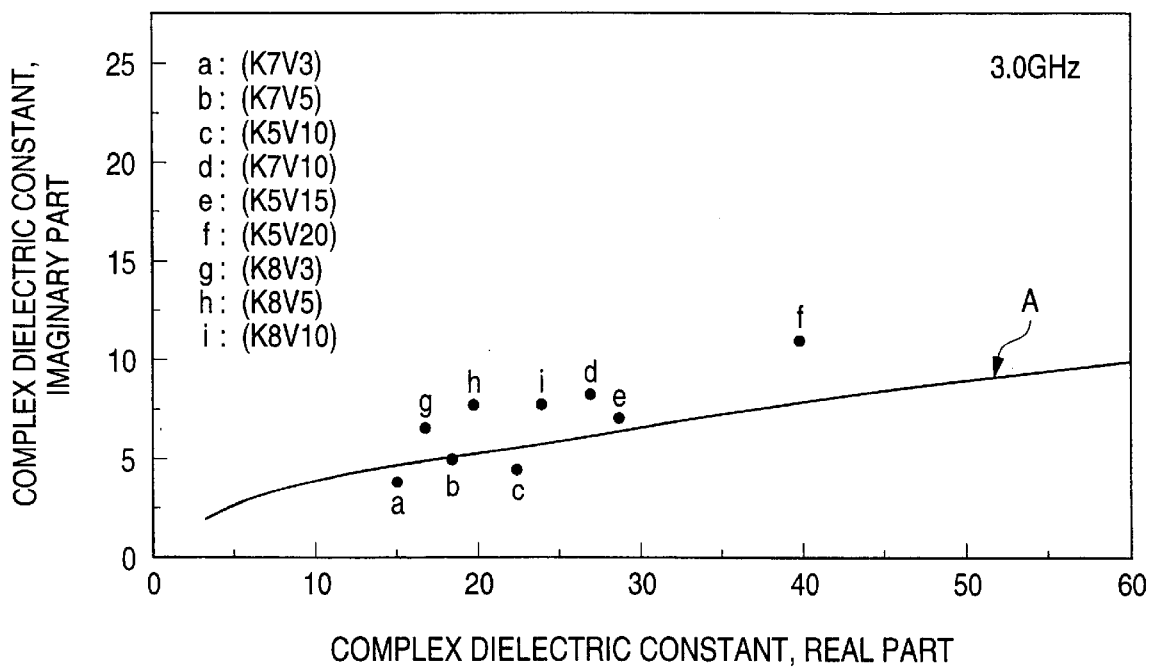
FIG. 3 is a graph showing the relationship between the imaginary part and the real part of the complex dielectric constant measured at a 3.0 GHz frequency for electromagnetic wave absorbing materials produced with the composition ratio of a carbon black and a gas phase growth carbon fiber changed.
Figure 4:
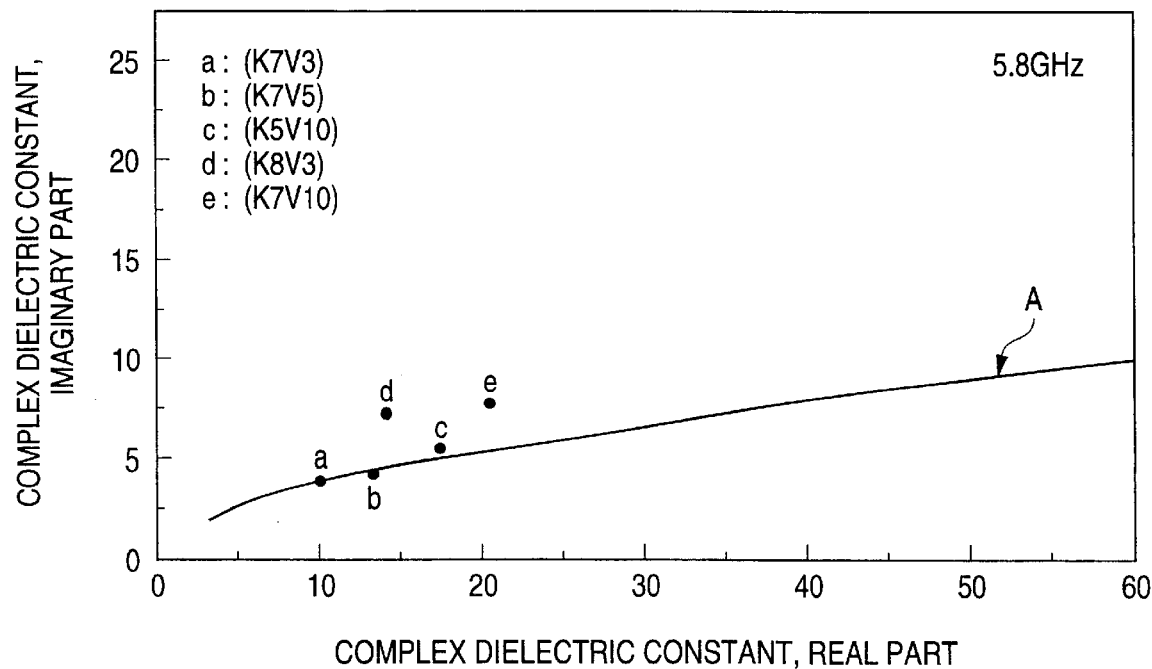
FIG. 4 is a graph showing the relationship between the imaginary part and the real part of the complex dielectric constant measured at a 5.8 GHz frequency for electromagnetic wave absorbing materials produced with the composition ratio of a carbon black and a gas phase growth carbon fiber changed.
Figure 5:
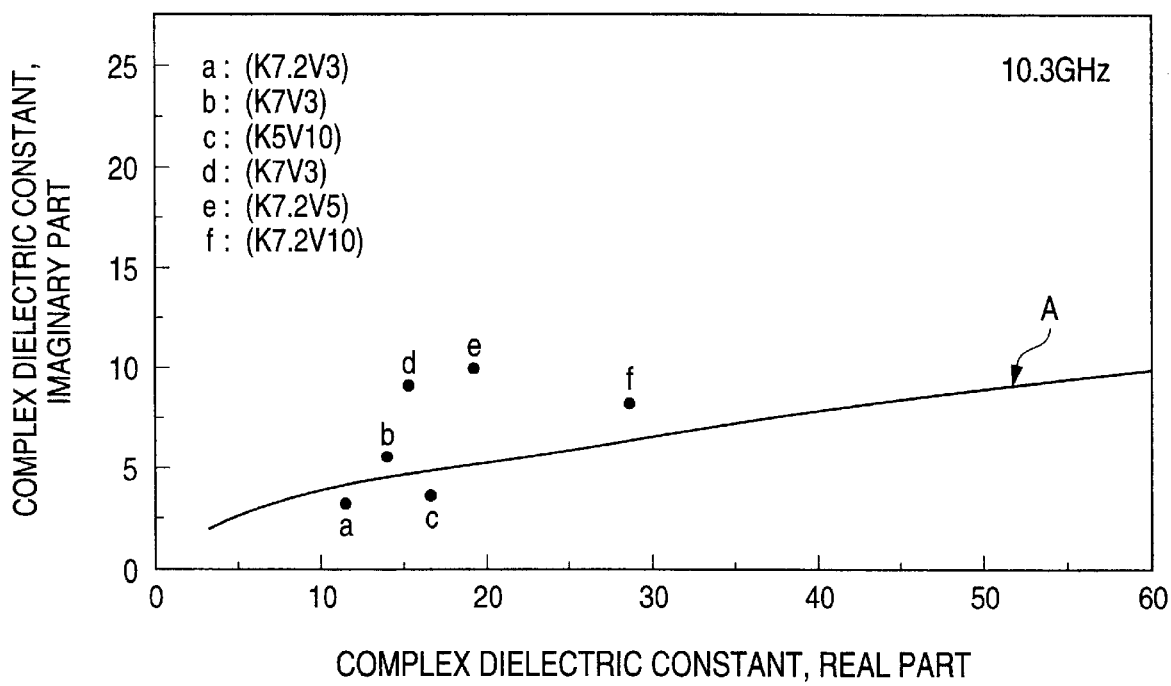
FIG. 5 is a graph showing the relationship between the imaginary part and the real part of the complex dielectric constant measured at a 10.3 GHz frequency for electromagnetic wave absorbing materials produced with the composition ratio of a carbon black and a gas phase growth carbon fiber changed.
Figure 6:
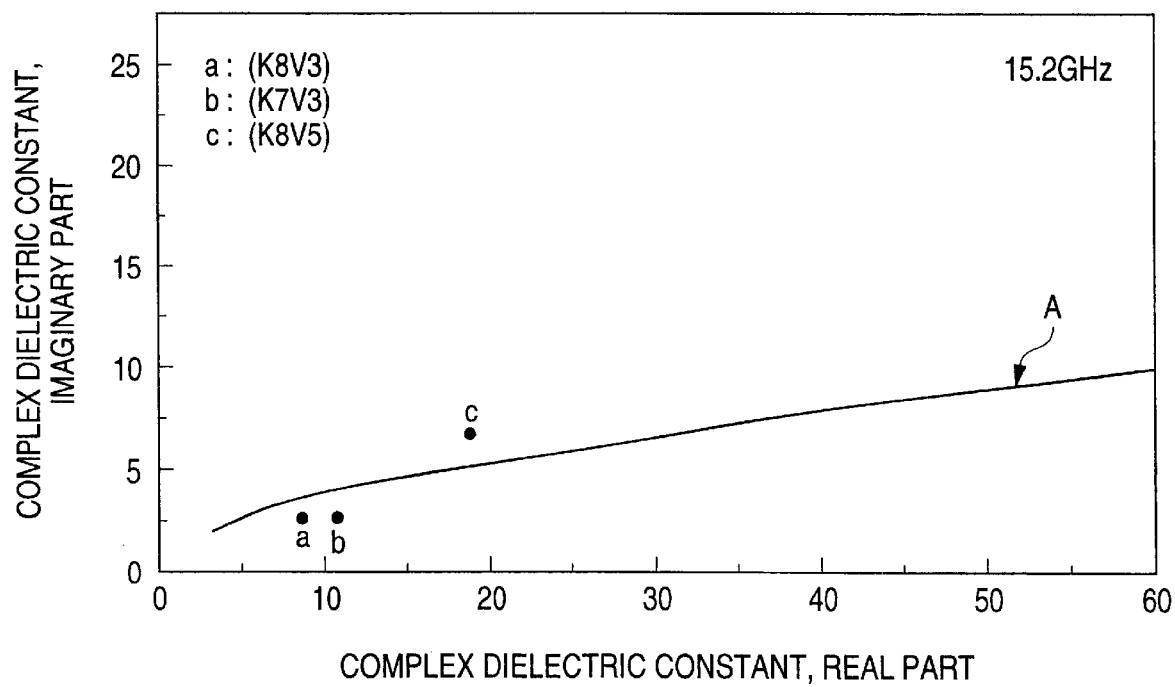
FIG. 6 is a graph showing the relationship between the imaginary part and the real part of the complex dielectric constant measured at a 15.2 GHz frequency for electromagnetic wave absorbing materials produced with the composition ratio of a carbon black and a gas phase growth carbon fiber changed.
Figure 7:
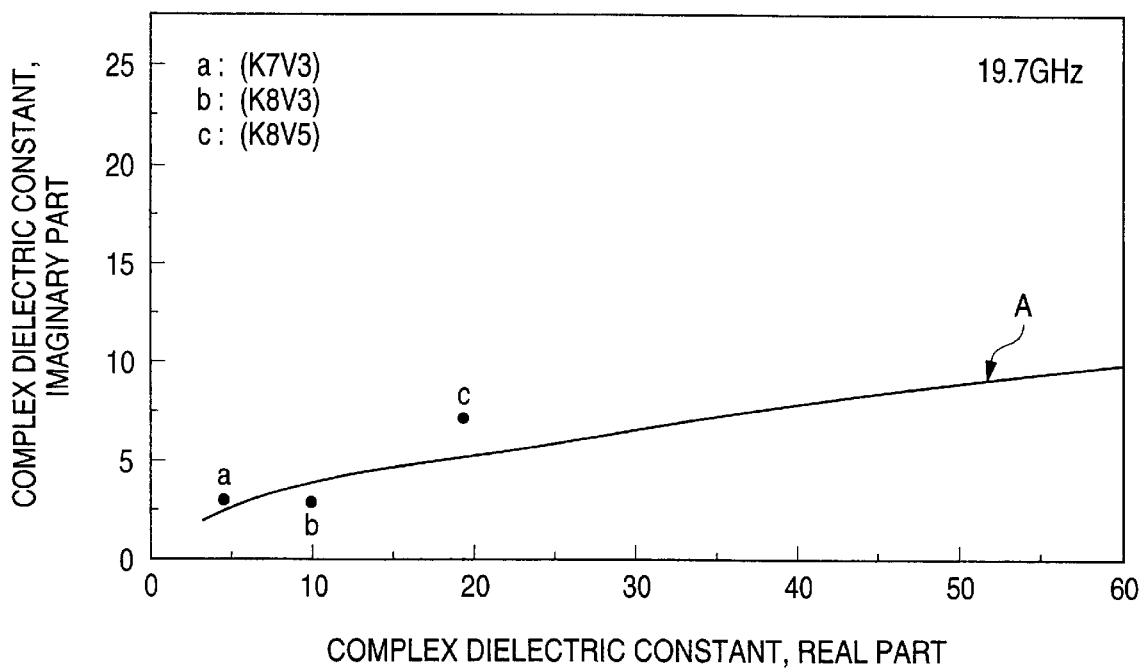
FIG. 7 is a graph showing the relationship between the imaginary part and the real part of the complex dielectric constant measured at a 19.7 GHZ frequency for electromagnetic wave absorbing materials produced with the composition ratio of a carbon black and a gas phase growth carbon fiber changed.
Figure 8:
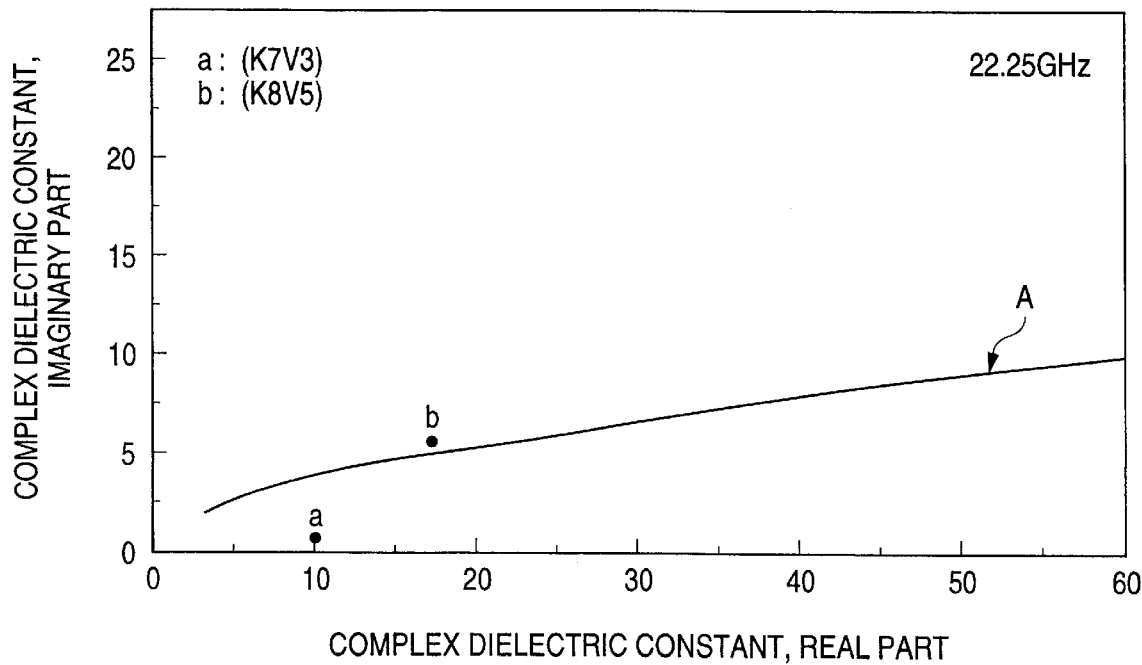
FIG. 8 is a graph showing the relationship between the imaginary part and the real part of the complex dielectric constant measured at a 22.25 GHz frequency for electromagnetic wave absorbing materials produced with the composition ratio of a carbon black and a gas phase growth carbon fiber changed.

Hereinafter, the invention will be explained in detail with reference to the drawings.

An electromagnetic wave absorbing material according to the invention is provided by shaping a resin composition containing a carbon black and a gas phase growth carbon fiber in a resin into a sheet, or the like.

In the invention, the kind of the resin is not particularly limited, and it can be selected optionally in consideration of the physical properties according to the application, such as the strength, the heat resistance, and the shaping property. Specific examples thereof include rubbers such as a chloroprene rubber, a chlorosulfonated polyethylene rubber, a chlorinated polyethylene rubber, an ethylene•α-olefin rubber, an ethylene•propylene rubber, a silicone rubber, acrylic rubber, a fluorine rubber, a styrene•butadiene rubber, and an isoprene rubber, thermoplastic resins such as a polyethylene, a polypropylene, a polyvinyl chloride, an ethylene-vinyl acetate copolymer, and an ethylene•acrylate copolymer, and thermosetting resins such as a silicone resin, a phenol resin, a urea resin, and an epoxy resin. Moreover, as needed, a mixture thereof can be used as well. Furthermore, as needed, various kinds of additives such as a solvent, a dispersing agent, a plasticizer, a cross-linking agent, an antioxidant, a vulcanization accelerator, a pigment, a non-conductive inorganic filler can be contained.

Moreover, the kind of the carbon black is not particularly limited, but it can be selected and used from those conventionally used for the electromagnetic wave absorbing materials, or those used for providing the conductivity to a synthetic resin. For example, a furnace black, an acetylene black, or the like can be used preferably. However, those having too large a particle size cannot sufficiently improve the dielectric loss. In contrast, those having too small a particle size provide an excessively large dielectric loss or a poor dispersing property. Therefore, as the carbon black, it is preferable to use that having about a 10 to 100 nm average particle size.

In the invention, a carbon fiber produced by the gas phase growth is used instead of the conventional carbon fiber. The gas phase growth carbon fiber, in general, having about a 0.1 to 1 μm fiber diameter, and about a 1 to 100 μm fiber length, is an extremely fine fiber compared with other carbon fibers, such as a polyacrylonitrile (PAN)-based carbon fiber. Therefore, in the case it is dispersed in a resin, despite a small amount, the contact points among the fibers and the contact points with the carbon black can be provided in a large number, and thus a high electromagnetic wave absorbing ability can be achieved.

The gas phase growth carbon fiber can be obtained by using an aromatic hydrocarbon such as a toluene, a benzene, and a naphthalene, or an aliphatic hydrocarbon such as a propane, an ethane, an ethylene, and an acetylene, preferably, a benzene or a naphthalene as the material, gasifying and introducing the same into a reaction range of 900 to 1,500° C. together with a reducing carrier gas such as a hydrogen, and contacting the same with a dispersed floating hydrocarbon decomposed catalyst. As the hydrocarbon decomposed catalyst, metal fine particles, such as fine particles having a 1,000 to 3,000 nm of an iron, a nickel, an iron-nickel alloy, or the like, are used commonly.

Moreover, as needed, the obtained gas phase growth carbon fiber can be pulverized by a ball mill, a rotor speed mill, a cutting mill, or another known pulverizing machine. The gas phase growth carbon fiber is, in general, made to be a short fiber automatically by being kneaded with a resin. However, by preliminarily pulverizing the same, the dispersing property with respect to the resin can be improved so that a further homogeneous resin composition can be obtained in a short time. Also in the electromagnetic wave absorbing material according to the invention, for the same reason, the gas phase growth carbon fiber preferably has a 0.1 to 1 μm fiber diameter, and a 50 μm or less fiber length, and it is preferable to use one pulverized and classified. Furthermore, as needed, it is also possible to execute a baking operation at a high temperature of about 1,300 to 2,300° C. in an inert gas such as an argon. Accordingly, the thermal stability can be improved.

The amount of the above-mentioned carbon black and gas phase growth carbon fiber is determined as follows according to the frequency of the electromagnetic wave to be absorbed.

In general, a one layer type electromagnetic wave absorbing material used is bonded with a metal foil or a metal plate, and the non-reflection condition formula at the time is represented as follows.

$$1 = 1 / \sqrt{\varepsilon_r} \cdot \tanh\left(j \cdot 2\pi d / \lambda \cdot \sqrt{\varepsilon_r}\right) \tag{1}$$

Here, d is the thickness of the electromagnetic wave absorbing material, and $\lambda$ is the wavelength of the electromagnetic wave to be absorbed. Moreover, $\varepsilon r$ is the complex dielectric constant of the electromagnetic wave absorbing material, which is changed both in the real part and in the imaginary part according to the frequency.

Figure 11:
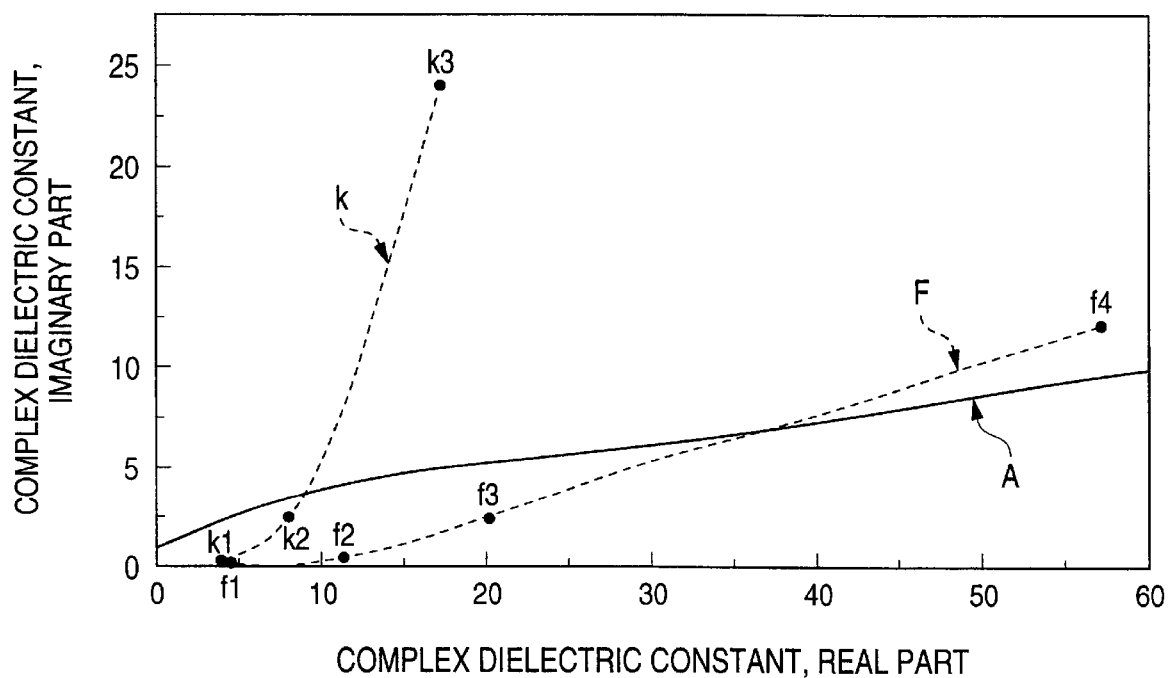
FIG. 11 is a graph showing the non-reflection curve at an optional wavelength $\lambda$.

A graph of the real part and the imaginary part of a complex dielectric constant satisfying the above-mentioned non-reflection condition formula for a wavelength λ with the d/λ as the parameter on a complex plane is called a "non-reflection curve", which is for example the curve A shown in FIG. 11.

Moreover, the complex dielectric constant is inherent to the kind or the composition of an electromagnetic wave absorbing material. For example, by measuring the complex dielectric constant of an electromagnetic wave absorbing material with only a carbon black added, with the amount of the carbon black changed, and plotting the real part and the imaginary part thereof on the complex plane of FIG. 11, the relationship of the curve K can be obtained. Furthermore, as to an electromagnetic wave absorbing material with only a gas phase growth carbon fiber added, similarly, the relationship of the curve F can be obtained. In the curve K, the amount of the carbon black at each point is k1<k2<k3. With the carbon black amount increased, the increase ratio of the imaginary part is enlarged. In contrast, in the curve F, the amount of the gas phase growth carbon fiber at each point is f1<f2<f3 <f4. With the gas phase growth carbon fiber amount increased, the increase ratio of the real part is enlarged. Therefore, by mixing the carbon black and the gas phase growth carbon fiber, and adjusting the mixing ratio, an electromagnetic wave absorbing material having a complex dielectric constant identical with the non-reflection curve A can be obtained.

The present inventors have produced various electromagnetic wave absorbing materials with the mixing ratio of the carbon black and the gas phase growth carbon fiber changed, measured the complex dielectric constant thereof at an optional frequency, plotted the real part and the imaginary part on a complex plane, and compared the same with the non-reflection curve A. FIGS. 1 to 8 show the results of frequencies 1.0 GHz, 2.0 GHz, 3.0 GHz, 5.8 GHz, 10.3 GHz, 15.2 GHz, 19.7GHz, and 22.25 GHz. For each point in the graphs, the numerals on the right of K is the carbon black amount, and the numerals on the right of V is the gas phase growth carbon fiber amount. The unit is the part by weight based on 100 parts by weight of the resin.

As shown in the graphs, at any frequency, by mixing 5 to 10 parts by weight of the carbon black and 1 to 10 parts by weight of the gas phase growth carbon fiber with respect to 100 parts by weight of the resin, an electromagnetic wave absorbing material can be obtained with a complex dielectric constant substantially identical with the non-reflection curve A. Compared with the conventional electromagnetic wave absorbing materials, for example, the electromagnetic wave absorbing material disclosed in JP-A-8–172292 containing 30 to 60 parts by weight of a furnace black and 5 to 20 part by weight of a carbon short fiber, and the electromagnetic wave absorbing material disclosed in JP-A-10–27986 containing total 20 part by weight or more of a carbon black and a carbon fiber as mentioned in the embodiment, the electromagnetic wave absorbing material according to the invention contains a drastically small amount of a carbon black and a gas phase growth carbon fiber. Moreover, despite the small amount of the carbon black and the gas phase growth carbon fiber, the electromagnetic wave absorbing material according to the invention has an absorbing ability of 27 dB as the peak reflection attenuation amount, which is same as or more than that of the conventional electromagnetic wave absorbing materials, as described in the following embodiments.

By calculating the thickness d from the wavelength λ of a measured frequency and a selected (d/λ) for the electromagnetic wave absorbing material with a composition ratio to be identical with or closest to the non-reflection curve A obtained as mentioned above, an electromagnetic wave absorbing material optimum for absorbing an electromagnetic wave having a frequency same as the measured frequency.

The production method for the electromagnetic wave absorbing material according to the invention is not particularly limited, but the electromagnetic wave absorbing material can be obtained by, for example, producing a resin composition by kneading a resin with a predetermined amount of a carbon black and a gas phase growth carbon fiber added by a known kneading machine such as a two roll mill, a kneader, an intermix, and a banbary mixer, and shaping the same into a sheet with a predetermined thickness, or the like. Here, since the amount of the carbon black and the gas phase growth carbon fiber is small, homogeneous dispersion into the resin can be enabled without the need of requiring a long time for kneading at the time of preparing the resin composition. Moreover, although the shaping condition can be same as the conventional embodiment, since the resin composition is a lowly filled material with a high flowability, a condition more moderate than that of the conventional embodiment can be enabled, such as a reduced extrusion pressure in the case of executing extrusion molding.

Furthermore, for providing to the practical use, similar to the conventional electromagnetic wave absorbing materials, a complex material with a metal obtained by attaching a plate or a foil of a metal such as an aluminum and a copper, or by applying a metal coating on one surface of the electromagnetic wave absorbing material is mounted on the part to be attached with the electromagnetic wave absorbing material disposed on the electric wave incident side. Since the electromagnetic wave absorbing material according to the invention contains a small amount of a carbon black and a gas phase growth carbon fiber, it is lightweight, and highly flexible so as to be handled easily with a good application property.

EXAMPLES

Hereinafter the invention will be explained further explicitly with reference to examples, but the invention is not limited thereto.

Example 1

Figure 9:
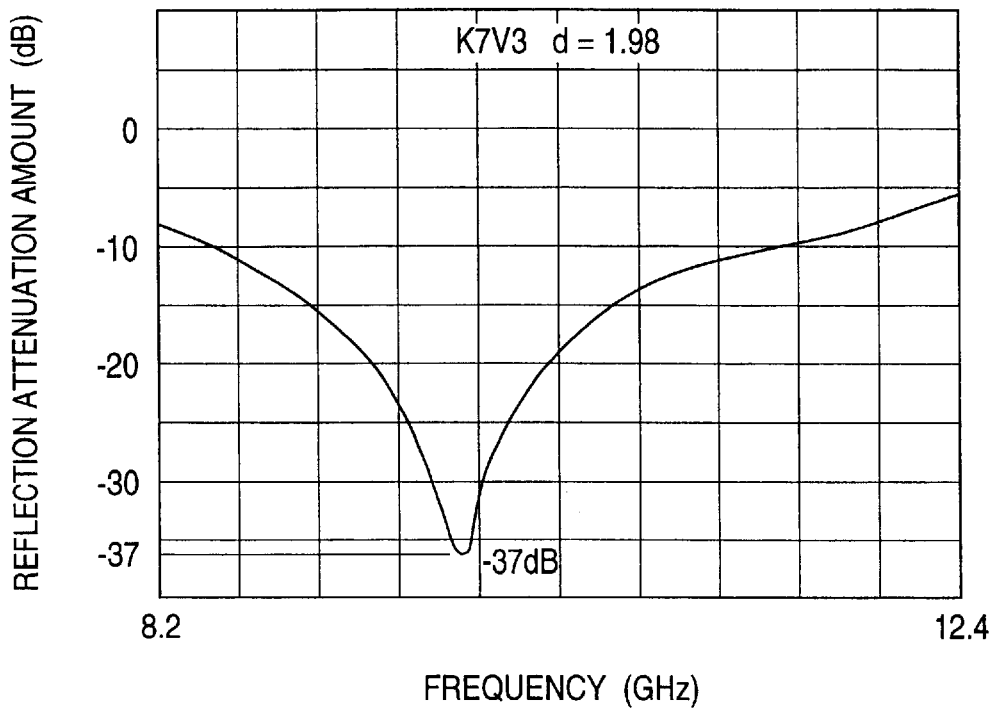
FIG. 9 is a graph showing the results of measuring the reflection attenuation amount in a 8.2 GHz to 12.4 GHz frequency range in the example 1.

A resin composition was produced by adding 7.0 parts by weight of a carbon black (produced by Lion Corp. "Ketchen Black EC") and 3 parts by weight of a gas phase growth carbon fiber (produced by Showa Denko Corp. "VGCF"; fiber diameter 0.1 to 0.5 μm; fiber length 1 to 100 μm) to 100 parts by weight of a polyethylene, and kneading the same with a two roll mill. An electromagnetic wave absorbing material was produced by shaping the resin composition into a 1.98 mm thickness and 150 mm square sheet-like shape with a steam press. Then, an electric wave of a 8.2 GHz to 12.4 GHz frequency was incident on the obtained electromagnetic wave absorbing material with a copper foil bonded, for measuring the reflection attenuation amount thereof. Results are shown in FIG. 9. The absorption peak is in the vicinity of about 9.5 GHz, with the value thereof −37 dB.

Example 2

Figure 10:
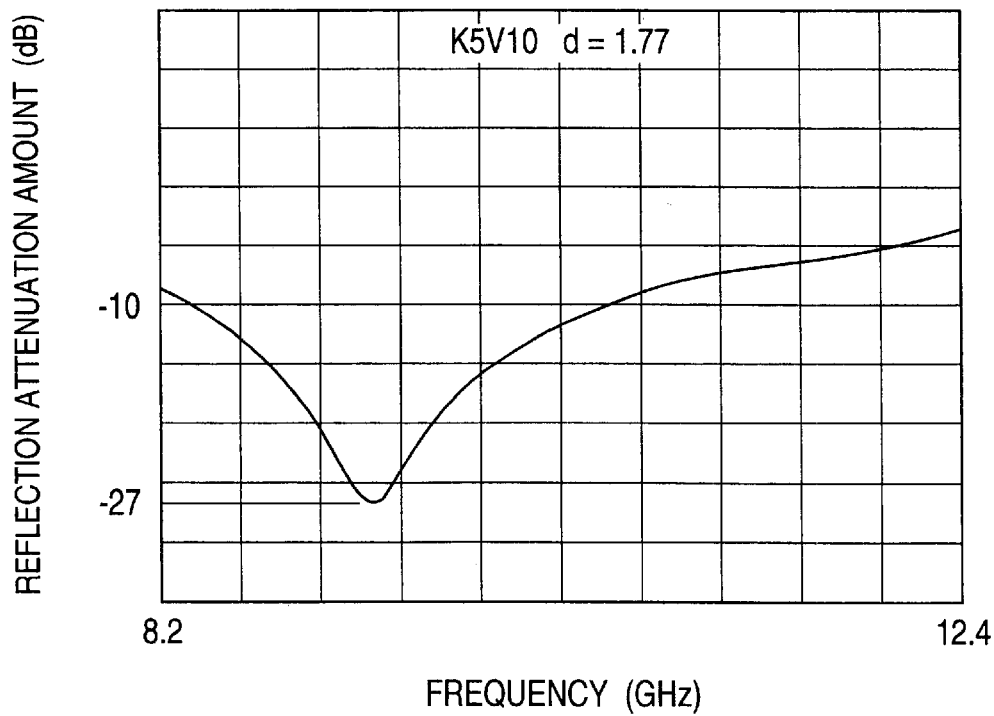
FIG. 10 is a graph showing the results of measuring the reflection attenuation amount in a 8.2 GHz to 12.4 GHz frequency range in the example 2.

Similar to the example 1, a resin composition was produced by adding 5.0 parts by weight of a carbon black and 10 parts by weight of a gas phase growth carbon fiber to 100 parts by weight of a polyethylene, and shaping the same into a 1.77 mm thickness and 150 mm square sheet-like shape with a steam press so as to produce an electromagnetic wave absorbing material. Then, an electric wave of a 8.2 GHz to 12.4 GHz frequency was incident on the obtained electromagnetic wave absorbing material with a copper foil bonded, for measuring the reflection attenuation amount thereof. Results are shown in FIG. 10. The absorption peak is in the vicinity of about 9.5 GHz, with the value thereof −27 dB.

The electromagnetic wave absorbing ability of the electromagnetic wave absorbing materials shown in the above-mentioned examples 1 and 2 is same as or higher than, for example, the electromagnetic wave absorbing ability (28 dB in the vicinity of the center frequency 9.5 GHz) of the electromagnetic wave absorbing material disclosed in the example 3 of JP-A-10–27986. However, according to comparison of the composition, the total amount of the carbon black and the gas phase growth carbon fiber of the electromagnetic wave absorbing materials shown in the examples 1 and 2 of the invention is smaller than the total amount of the carbon black and the carbon fiber of the electromagnetic wave absorbing material disclosed in the example 3 of the JP-A-10–27986. Therefore, it is learned that the amount of the carbon black and the gas phase growth carbon fiber can be reduced by the invention.

COMPARATIVE EXAMPLE

Figure 12:
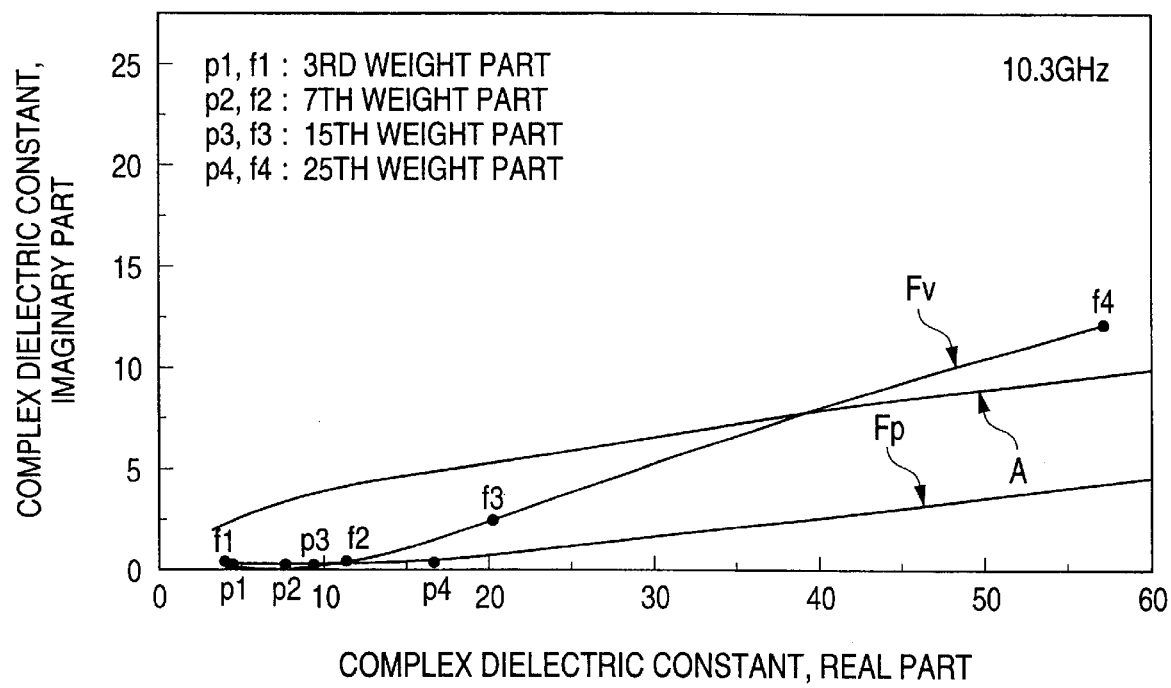
FIG. 12 is a graph showing the results of measuring the complex dielectric constant of the electromagnetic wave absorbing materials with the gas phase growth carbon fiber added, and the electromagnetic wave absorbing materials with the PAN-based carbon fiber added in the reference example.

Various electromagnetic wave absorbing materials were produced with a gas phase growth carbon fiber (produced by Showa Denko Corp. "VGCF"; fiber diameter 0.1 to 0.5 $\mu$m; fiber length 1 to 100 $\mu$m), and a PAN-based carbon fiber (produced by Toray Corp. "MLD-300"; fiber diameter 7 $\mu$m; fiber length 300 $\mu$m) added to a polyethylene each by 3 parts by weight, 7 parts by weight, 15 parts by weight, and 25 parts by weight. The real part and the imaginary part of the complex dielectric constant of each electromagnetic wave absorbing material at a 10.3 GHz frequency were measured and plotted on the complex plane as shown in FIG. 11. Results are shown in FIG. 12. In the graph, the curve Fv represents an electromagnetic wave absorbing material with the gas phase growth carbon fiber added, and the curve Fp represents an electromagnetic wave absorbing material with the PAN-based carbon fiber added. Even though the amount of the PAN-based carbon fiber is increased, the imaginary part increase can hardly be observed, and thus a considerably large amount should be added for intersecting the non-reflection curve A. Also from this fact, it is learned that the amount of the gas phase growth carbon fiber can be reduced in the electromagnetic wave absorbing material of the invention.

As heretofore explained, the electromagnetic wave absorbing material according to the invention show the excellent electromagnetic wave absorbing ability in a wide frequency range in the vicinity of 1 to 20 GHz despite a small content of the carbon black, the gas phase growth carbon fiber, or the like. Since the content of the carbon black, the gas phase growth carbon fiber, or the like is small, the excellent operation property and application property can be provided.

What is claimed is:

1. An electromagnetic wave absorbing material comprising:
    a resin composition;
    a carbon black in 5 to 10 parts by weight in the resin based on 100 parts by weight of the resin;
    a gas phase growth carbon fiber in 1 to 10 parts by weight in the resin based on 100 parts by weight of the resin.
2. The electromagnetic wave absorbing material according to claim 1, wherein the gas phase growth carbon fiber has a 0.1 to 1 $\mu$m fiber diameter and a 100 $\mu$m or less fiber length.

* * * * *